(12) United States Patent
Shor et al.

(10) Patent No.: US 10,998,889 B2
(45) Date of Patent: May 4, 2021

(54) RING OSCILLATOR TEMPERATURE SENSOR

(71) Applicant: Bar Ilan University, Ramat Gan (IL)

(72) Inventors: Joseph Shor, Tel Mond (IL); Natan Vinshtok-Melnik, Rehovot (IL)

(73) Assignee: Birad-Research & Development Company Ltd., Ramat Gan (IL)

( * ) Notice: Subject to any disclaimer, the term of this patent is extended or adjusted under 35 U.S.C. 154(b) by 690 days.

(21) Appl. No.: 15/851,755

(22) Filed: Dec. 22, 2017

(65) Prior Publication Data
US 2019/0199329 A1 Jun. 27, 2019

(51) Int. Cl.
| | |
|---|---|
| *H03K 3/03* | (2006.01) |
| *G01K 7/01* | (2006.01) |
| *G01K 7/32* | (2006.01) |
| *H03L 1/02* | (2006.01) |
| *H03M 1/10* | (2006.01) |
| *G01R 31/26* | (2020.01) |
| *H03M 1/00* | (2006.01) |
| *H03B 5/32* | (2006.01) |
| *G01K 17/00* | (2006.01) |
| *G01R 19/00* | (2006.01) |
| *H03L 1/04* | (2006.01) |
| *G01K 7/00* | (2006.01) |

(52) U.S. Cl.
CPC ............. *H03K 3/0315* (2013.01); *G01K 7/00* (2013.01); *G01K 7/01* (2013.01); *G01K 7/32* (2013.01); *G01K 17/00* (2013.01); *G01R 19/0084* (2013.01); *G01R 31/2644* (2013.01); *H03B 5/32* (2013.01); *H03L 1/021* (2013.01); *H03L 1/04* (2013.01); *H03M 1/004* (2013.01); *H03M 1/1019* (2013.01); *H03M 1/1028* (2013.01); *H03M 1/1061* (2013.01)

(58) Field of Classification Search
CPC ...... H03K 3/0315; H03K 3/012; H03K 3/354; H03K 21/08; H03L 1/04; H03L 1/021; G01K 7/01; G01K 7/00; G01K 7/32; G01K 17/00; G01R 19/0084; G01R 31/2644; H03M 1/1061; H03M 1/1019; H03M 1/1028; H03M 1/004; H03B 5/32
USPC .................. 331/57, 2, 46, 185, 176; 438/17; 324/762.01; 702/79; 374/183
See application file for complete search history.

(56) References Cited

U.S. PATENT DOCUMENTS

| | | | |
|---|---|---|---|
| 10,305,454 B2 * | 5/2019 | Khare ....................... H03L 1/00 |
| 2020/0153416 A1 * | 5/2020 | Delshadpour ........... H03L 1/022 |

* cited by examiner

*Primary Examiner* — Arnold M Kinkead
(74) *Attorney, Agent, or Firm* — Dekel Patent Ltd.; David Klein (57) ABSTRACT

A sensor circuit includes at least one ring oscillator having a supply port supplied by at least one current source and a reference frequency. A comparator compares a frequency output of the at least one ring oscillator with the reference frequency to yield a measurement, such as a temperature measurement.

15 Claims, 7 Drawing Sheets

RING OSCILLATOR TEMPERATURE SENSOR

FIELD OF THE INVENTION

The present invention relates generally to temperature sensors in integrated circuits, and particularly a ring oscillator used as a temperature sensor.

BACKGROUND OF THE INVENTION

A plurality of temperature sensors may be integrated on a chip and used to monitor temperature at various locations on the chip. Temperature readings from the sensors may be fed to a temperature management device that manages circuits (e.g., central processing unit (CPU)) on the chip based on the temperature readings. For example, the temperature management device may manage the circuits based on the temperature readings to prevent the temperature at one or more locations on the chip from becoming too high, which can potentially damage the chip. In this example, if a temperature reading rises above a temperature threshold, then the temperature management device may take steps to reduce the temperature (e.g., reduce a frequency of a circuit).

Figure 1A:
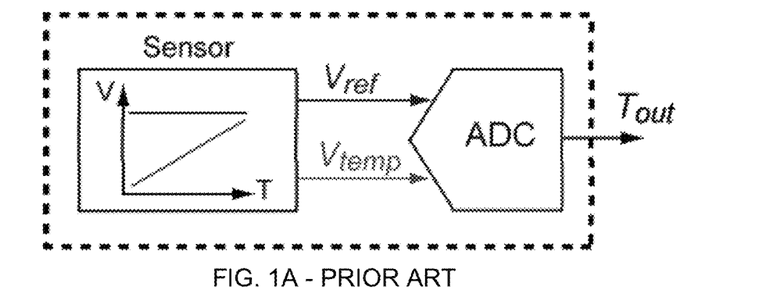
FIG. 1A is a block diagram of a prior art thermal sensor.

FIG. 1A shows a block diagram of a prior art thermal sensor. In general there is a sensing circuit, usually a bandgap reference circuit (BGREF) which produces two outputs, a temperature dependent output and a reference voltage, which does not change with temperature. The temperature dependent output can be PTAT (proportional to absolute temperature, or rising with increased temperature) or CTAT (Complementary to absolute temperature, or falling with increased temperature).

Figure 1B:
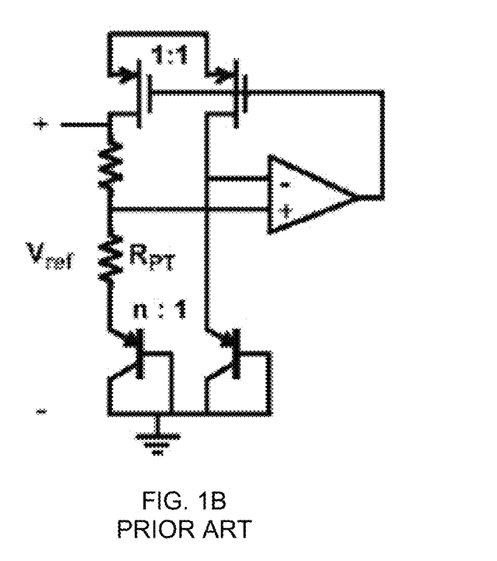
FIG. 1B is a schematic of a typical BGREF circuit used in the prior-art for temperature sensing.

FIG. 1B shows a typical BGREF circuit used in the prior-art. The circuit utilizes Bipolar Junction Transistors (BJT) or diodes as sensing elements. The equation for current in a BJT (or diode) is:

$$I_C = I_S \exp\left(\frac{qV_{be}}{KT}\right) \text{ and } V_{BE} = V_{g00} - \lambda T \quad [1]$$

where Ic is the collector current, Vbe is the base-emitter voltage, K=Boltzman's constant, T=temperature, q=electron charge, Vg00 is the extrapolated Vbe at 0 K and λ is its linear temperature coefficient. Using equation 1, the CTAT and PTAT terms of the BGREF can be calculated for the circuit in FIG. 2 to be:

$$V_{ref} = V_{be} + \frac{R_1}{R_2} * \frac{KT}{q} \ln(n) \quad [2]$$

As can be seen in equation 2, the BGREF creates both a PTAT term and a CTAT term (Vbe). The problem with BGREF circuits is that they tend to be very large in advanced CMOS process nodes, since the parasitic BJT's used are very large circuit elements and many of these elements are required in the sensor. The sensor also requires a high precision analog to digital converter (ADC), which requires significant area and power.

In principal, a subthreshold MOS transistor has similar equations as a BJT and can be used to substitute the BJT in the sensor in prior-art devices. However, the area and power of the ADC are still required.

Ring oscillator sensors have been utilized in the prior art as thermal sensors, in which there is a high precision reference frequency present in the existing computer system which can be utilized to measure the temperature dependent RO frequencies and an ADC is not needed. However such ring oscillator sensors are more sensitive to Vcc than they are to temperature, such that a high precision reference voltage is also required, which is generally generated by an area and power consuming BGREF.

SUMMARY OF THE INVENTION

The present invention seeks to provide a ring oscillator used as a temperature sensor, as is described more in detail hereinbelow. In one embodiment, the ring oscillator may operate at subthreshold.

The ring-oscillator (RO) based sensor may be placed in a BGREF configuration instead of the BJT's. When working in subthreshold, the ring oscillator has similar equations to a subthreshold MOS and can produce a temperature dependent frequency. Thus both the BJT's and the ADC's are eliminated, thereby providing significant savings in area and energy consumption.

BRIEF DESCRIPTION OF THE DRAWINGS

The present invention will be understood and appreciated more fully from the following detailed description taken in conjunction with the drawings in which:

FIGS. 8 and 9 are graphical illustrations of the ring-oscillator temperature sensor of the present invention compared with the prior art, in which

DETAILED DESCRIPTION OF EMBODIMENTS

Figure 1C:
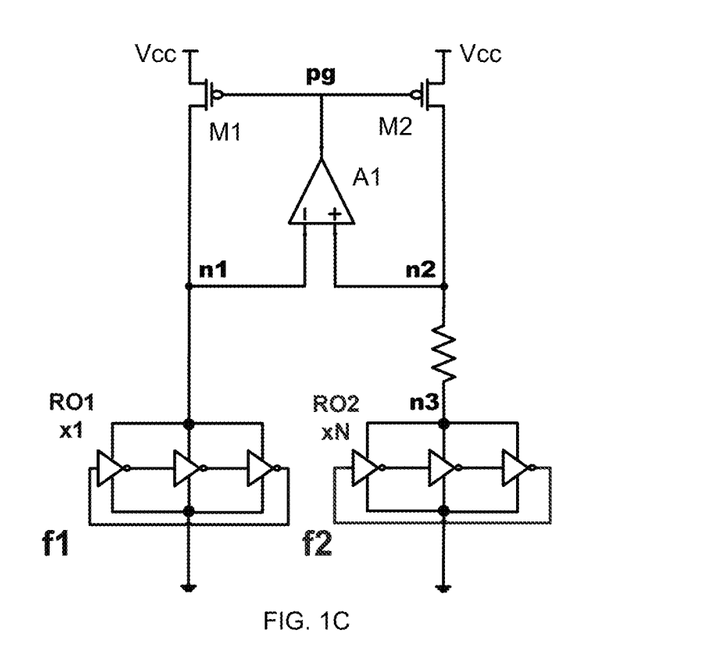
FIG. 1C is a simplified circuit diagram of a ring oscillator for measuring temperature, in accordance with a non-limiting embodiment of the present invention.

Reference is now made to FIG. 1C, which illustrates a simplified circuit diagram of a ring oscillator for measuring temperature, in accordance with a non-limiting embodiment of the present invention.

The non-limiting circuitry of FIG. 1C is now described. In general, throughout the specification and claims, the term "connected" means a direct electrical connection between the things that are connected, without any intermediary devices. The term "coupled" means either a direct electrical connection between the things that are connected or an indirect connection through one or more passive or active intermediary devices. The term "circuit" or "circuitry" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on." For purposes of the embodiments, the transistors are metal oxide semiconductor (MOS) transistors, which include drain, source, gate, and bulk terminals, but the transistors may include any device implementing transistor functionality, such as without limitation, bi-polar junction transistors—BJT PNP/NPN, BiCMOS, CMOS, eFET, etc. Note that the inverter elements shown in the schematics have an input and an output which are shown explicitly in the schematic, but there is also implied a positive supply terminal (Vcc) and a negative supply terminal (Vss) of the inverters. When the negative and positive supply terminals are not connected to anything, it is implied that the negative supply terminal is connected to Vss, the negative supply, while the positive supply terminal is connected to Vcc, the positive supply, as is known in the art. Some of the schematics show connections of the implied negative and positive supply terminals to different supplies.

A first ring oscillator RO1 includes an odd number of inverters (output of the first inverter is coupled to the input of the next inverter, whose output is coupled to the input of the next inverter and so on; the output of the last inverter is coupled to the input of the first inverter). In the illustration, there are three stages (three inverters); however, the invention is not limited to this amount of stages, and the oscillator can operate with other numbers of stages (e.g., 5 or 7 stages). Another ring oscillator RO2 is provided. Ring oscillator RO2 may have a size which is N times the size of ring oscillator RO1. This can be accomplished by placing N instances of the basic RO template (such as 3 inverters or stages) in RO2 in the schematic, while RO1 has only one instance of the basic RO template. Since the currents are made equal by the feedback loop, the current density of RO1 will be a multiple (×N) of the current density in RO2.

Positive supply terminals of the inverters of RO1 are coupled to a node n1; negative supply terminals of the inverters of RO1 are coupled to ground. Positive supply terminals of the inverters of RO2 are coupled to a node n3 and then coupled from node n3 via a resistor to a node n2; negative supply terminals of the inverters of RO1 are coupled to ground.

Node n1 is coupled to a negative input of an amplifier A1 and node n2 is coupled to a positive input of amplifier A1. An output of amplifier A1 is coupled to a node pg. Without limitation, amplifier A1 may be a differential to single ended amplifier.

Node n1 is coupled to a drain of a PMOS transistor (current source) M1; node n2 is coupled to a drain of a PMOS transistor (current source) M2. Gates of transistors M1 and M2 are coupled to each other via node pg. Sources of transistors M1 and M2 are each coupled to Vcc.

The ring oscillator acts as a variable resistance load, where the resistance changes as a function of the temperature. The internal nodes of the circuit n1, n2, and n3 act similarly to Vbe nodes in the prior art BGREF configuration shown in FIG. 1B. The current in the branches of the circuit rises as a function of the temperature. The nodes n1 and n2 are kept at equal voltages due to the negative feedback provided by the differential to single ended amplifier A1 which regulates the node pg. The currents in the PMOS current sources M1 and M2 are equaled or scaled versions of each other so that the currents in the two ring oscillators RO1 and RO2 are substantially either equal or scaled. The meaning of scale is that the currents are a fixed multiple of each other, either an integer or fractional multiple. The action of the feedback loop regulates both the current in each of the ring oscillators. The voltage at the ring oscillators supply is determined by the threshold voltages (Vth) of PMOS and/or NMOS devices in the ring oscillators, and its temperature dependence is essential similar to Vth.

It is noted that the ring oscillators in FIG. 1C are connected at their positive supply ports to n3 and n1. In conventional CMOS circuits, ring oscillators are generally connected to the positive supply, Vdd, while in this circuit, the ring oscillator supply ports are connected to these internal circuit nodes.

Figure 2A:
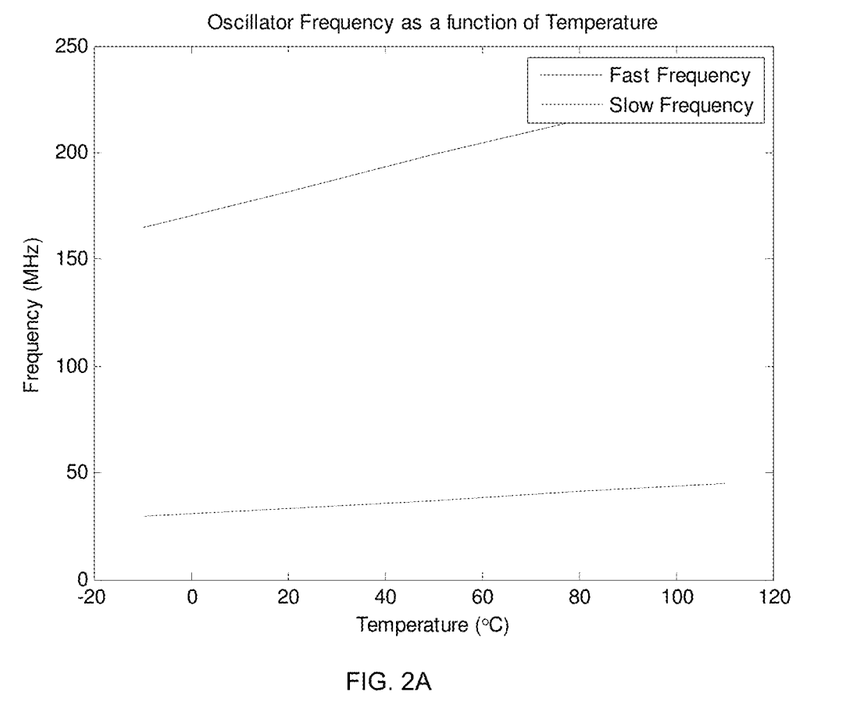
FIG. 2A is a graphical illustration of the performance of the ring oscillator circuitry of FIG. 1C, showing frequency as a function of temperature.
Figure 2B:
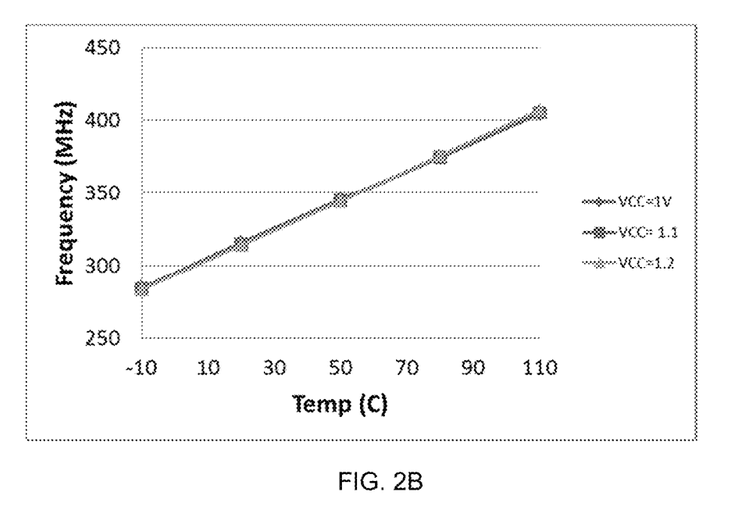
FIG. 2B is a graphical illustration of the performance of the ring oscillator circuitry of FIG. 1C, showing the sensor output frequency for different Vcc.

The frequencies in the circuit behave as shown in FIG. 2A. The frequencies are PTAT (proportional to the absolute temperature) and quite linear. FIG. 2B shows the sensor output at different Vcc levels, and shows clearly that the sensor's output is independent of Vcc and thus does not require a separate supply voltage or reference voltage.

In computer systems there is almost always a precision system clock which is generated by a crystal oscillator. Hence the temperature dependent frequency of the sensor of the invention can be measured against this system clock. This enables this sensor to operate without a precision voltage reference, since it utilizes the ever-present system clock as a frequency reference. This enables the sensor to be substantially smaller than conventional thermal sensors.

Due to the structure of the ring oscillator, the output of each oscillator is between the ground node and the supply node of the oscillator. The supply node of the oscillator is a non-constant value, and changes as a function of the temperature. In order to digitize the frequency at full Vcc level, a level shifter may be used, as is explained below with reference to FIG. 3. The level shifter is used to transfer the signal from one supply domain to another—from the non-constant supply domain of nodes n1 and n3, to the constant DVDD domain.

Figure 3:
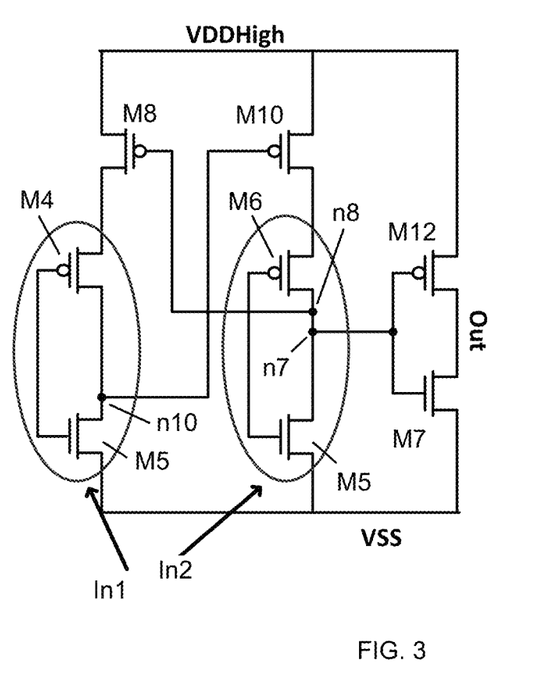
FIG. 3 is a simplified circuit diagram of a level shifter used to digitize the frequency at full Vcc level, wherein the level shifter is used to transfer the signal from one supply domain to another.

The utilized level shifter is shown in FIG. 3. The high voltage is labeled VDDHigh, while the inputs swing from VSS to VDDLow (the possible values of n1 and n3).

In the illustrated embodiment, a first variable supply inverter In1 includes an NMOS transistor M3, whose gate is coupled to a gate of a PMOS transistor M4. A source of M3 is coupled to VSS. A drain of M3 is coupled to a drain of M4. Similarly, a second variable supply inverter In2 includes an NMOS transistor M5, whose gate is coupled to a gate of a PMOS transistor M6. A source of M5 is coupled to VSS. A drain of M5 is coupled to a drain of M6.

A source of M4 is coupled to a drain of a PMOS transistor M8. A source of M8 is coupled to VDDHigh. A gate of M8 is coupled via a node n8 to the drains of M5 and M6. A gate of a PMOS transistor M10 is coupled via a node n10 to the drains of M3 and M4. A source of M10 is coupled to VDDHigh. A drain of M10 is coupled to a source of M6. A source of a PMOS transistor M12 is coupled to VDDHigh. A gate of M12 is coupled to a gate of an NMOS transistor M7 and is also coupled to the drains of M5 and M6 via a node n7. Drains of M7 and M12 are coupled to each other. A source of M7 is coupled to VSS.

Figure 4:
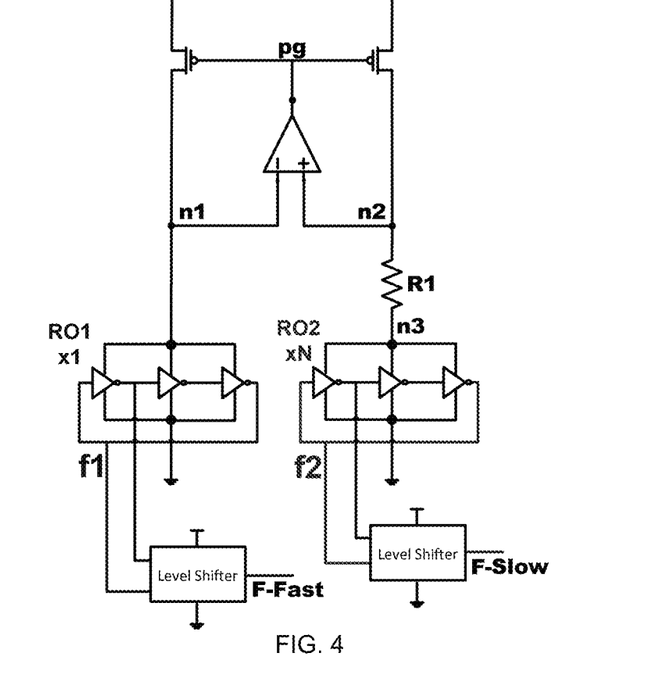
FIG. 4 is a simplified circuit diagram of the level shifter of FIG. 3 integrated in the circuitry of FIG. 1C.

The RO sensor integrated with the level shifter is shown in FIG. 4. In each ring oscillator, the input to In1 is coupled to the output of the first inverter and the output of the last inverter is coupled to the input to In2. The output of the level shifter coupled to ring oscillator RO1 is a relatively fast frequency and the output of the level shifter coupled to ring oscillator RO2 is a relatively slow frequency.

Although the circuitry of FIG. 1C is stable at many operating points, some operating conditions may lead to the amplifier A1 being out of its operating region, such as when nodes n1 and n2 are in mismatch and high currents may flow through the left and right branches, which leads to high oscillation frequencies of the ring oscillators. In order to avoid such a state, a start-up device may be placed between pg and the supply which reliably turns the circuit on and off. The start-up device prevents the system from reaching unstable states, and is used to dictate an initial condition on the circuit (it initializes the currents in the circuit). Initially, pg is pulled to the positive supply, and there are no significant currents in the left and right branch. Only leakage currents are present, and ideally, there is no oscillation. Subsequently, the start-up device is turned on, and PG gets initialized, such that the desired oscillations occur. After this, the start-up circuit is disabled.

Figure 5:
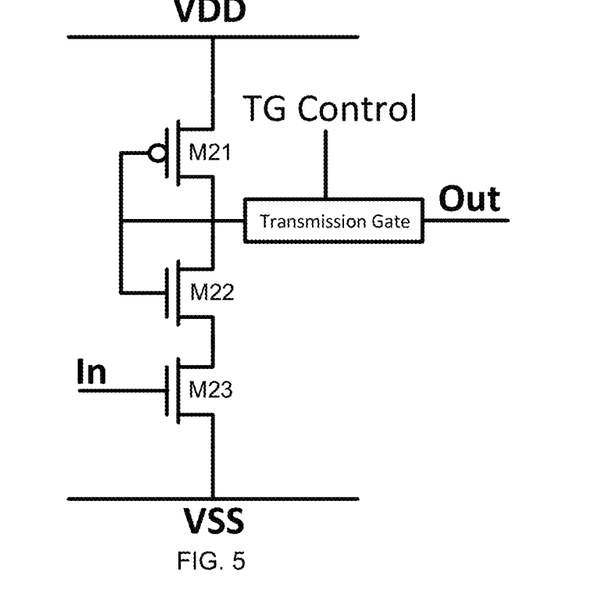
FIG. 5 is a simplified circuit diagram of a pull up device that may be used to reliably turn the circuit of FIG. 1C on and off.

Reference is now made to FIG. 5, which illustrates circuitry of a startup device, in accordance with an embodiment of the invention.

A PMOS transistor M21 has its source coupled to Vdd, and its gate and drain are coupled to each other and are also coupled to the gate and drain of an NMOS transistor M22. The drains and gates of M21 and M22 are coupled to each other. A source of M22 is coupled to a drain of an NMOS transistor M23. A source of M23 is coupled to Vss. An input signal for turning on or off the startup device is input into a gate of M23. An input of a transmission gate is coupled to the gates of M21 and M22.

Accordingly, the circuit consists of two diode connected devices (transistors M21 and M22), and an on/off device (the transmission gate). When the startup is active, current flows through the branch, and the value at the output is a function of the ratio between M21 and M22. The ratio between M21 and M22 is set, so as the output corresponds to a value close to the expected value of the node pg of the circuitry of FIG. 1C. This ratio is carefully chosen, so as the circuit functions for process corners, and expected variation. The device M23 is also used in order to turn off the startup, and conserve power.

Figure 6:
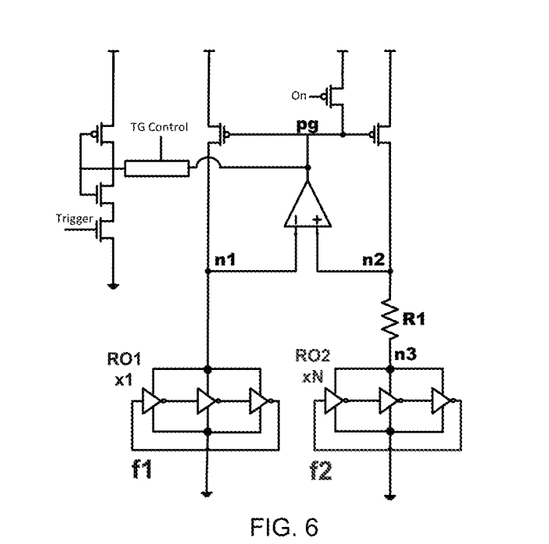
FIG. 6 is a simplified circuit diagram of the pull up device of FIG. 5 integrated in the circuitry of FIG. 1C.

Reference is now made to FIG. 6, which illustrates a circuit diagram of the circuit of FIG. 1C, and the pull up (i.e., startup and keeper) device of FIG. 5. Initially, ON=0 and pg is pulled up to Vcc. After this point ON is raised to Vcc, turning off the keeper and Trigger is raised to Vcc while TG_Control is enabled to make the transmission gate conducting. Current flows through the circuit, and pg is pulled down to a voltage, which is deemed to be in the operation region of amplifier A1. Both M23 and the transmission gate are subsequently closed, and the amplifier A1 corrects the value at its output to a stable operating condition of the circuit. To turn off the circuit, On is set to a logic '0', which pulls node pg up to the supply voltage, closing the PMOS current sources, thereby pulling nodes n1 and n2 towards ground.

The inputs Trigger and TG Control are used to control the start-up procedure, and On is used to turn the circuit on and off. Care should be taken in choosing the sizing of the devices in the start-up circuit and the keeper, in order to make them less susceptible to process variation.

Figure 7:
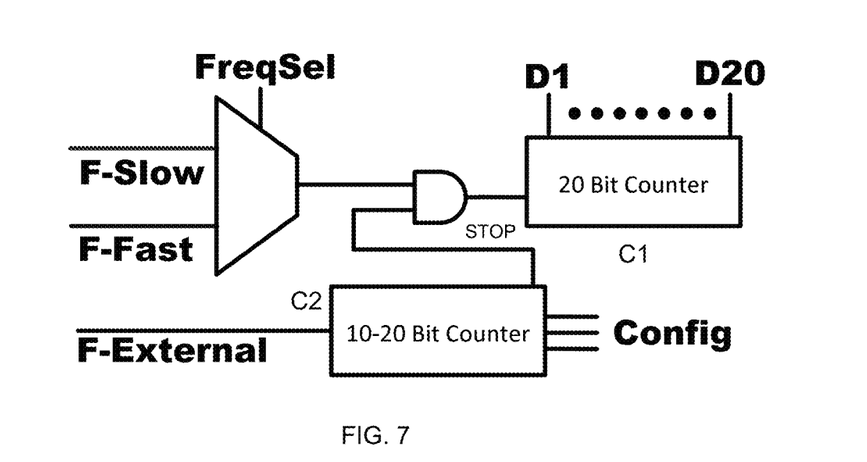
FIG. 7 is a simplified diagram of a digital comparator block that compares frequencies, which were shifted as described in FIGS. 3 and 4, with a reference frequency.

The frequencies shifted as described in FIGS. 3 and 4 may be input into a digital comparator block, which compares the frequencies with a reference frequency, as shown in FIG. 7. The digital comparator block may include a temperature-dependent frequency counter (such as, but not limited to, a 10-20 bit counter).

As noted above with reference to FIG. 4, the output of the level shifter coupled to ring oscillator RO1 is a relatively fast frequency and the output of the level shifter coupled to ring oscillator RO2 is a relatively slow frequency. The temperature dependent frequency outputs of the level shifters can be compared to a references frequency using a digital comparator, as shown in FIG. 7. In the circuitry of FIG. 7, the relatively slow frequency or the relatively fast frequency is input into frequency selector which selects which of them gets input into C1, a temperature-dependent counter. At the beginning of the count both counters are reset and the Stop bit is zero, such that the pulses of temperature dependent frequency are counted by C1. An external reference frequency is input into C2, the temperature-independent frequency counter. The Config bits determine the length of the counter C2, which ultimately determines the resolution of the temperature measurement. Once C2 is filled, then the Stop bit is asserted which freezes the count of C1. At this point the digital bits D20:D1 represent the temperature dependent frequency count, and are the digitized temperature measurement.

The operating method depends on the temperature-dependent frequency counter stopping when the temperature-independent frequency counter is filled. Thus, the temperature-dependent frequency counter counts how many rising edges the temperature-dependent frequency completed in a fixed amount of time. Thus, a temperature-dependent variable is compared to a temperature-independent variable, giving a unique answer for each different temperature. The time taken for the temperature-independent frequency counter to overflow is known as integration time. The system's resolution is dependent upon the number of bits of the temperature-independent frequency counter. The longer the integration time is, the higher the achievable resolution. The trade-off of a high resolution measurement is double— longer integration time, and integration of noise and jitter present in the system.

Figure 8:
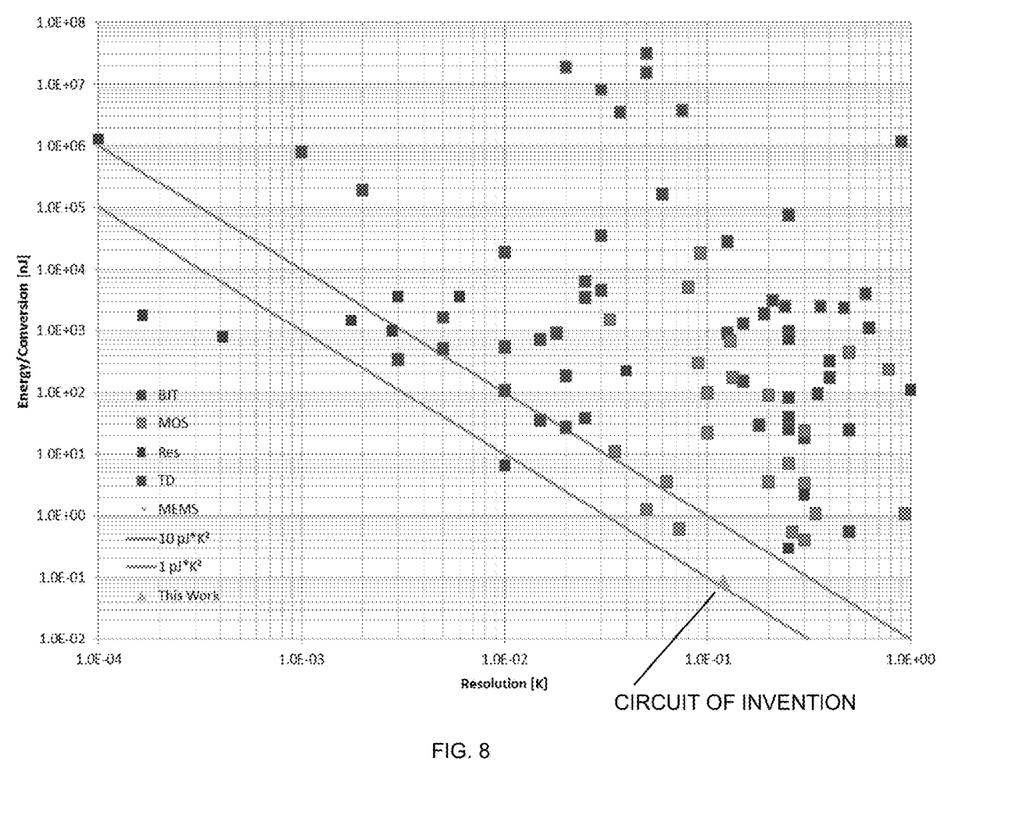
FIG. 8 is a graphical illustration of energy per conversion with resolution.
Figure 9:
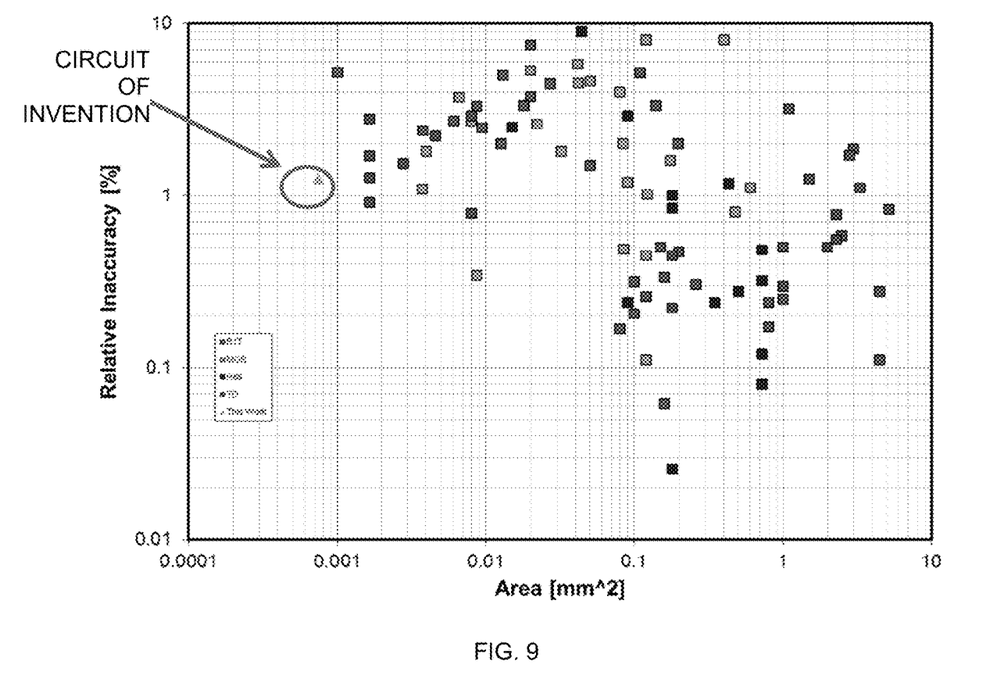
FIG. 9 is a graphical illustration of relative inaccuracy versus area.

FIGS. 8 and 9 illustrate the ring-oscillator temperature sensor of the present invention compared with the prior art. The prior art is taken from K.A.A. Makinwa, "Temperature Sensor Performance Survey," [Online]. Available: http://ei.ewi.tudelft.nl/docs/TSensor_survey.xls. The paper that provides the rationale for this survey is K.A.A. Makinwa, "Smart Temperature Sensors in Standard CMOS", (Proc. Eurosensors) Procedia Engineering, pp. 930-939, September 2010.

Quoting from "Smart Temperature Sensors in Standard CMOS": "Given the variety of smart temperature sensors that can be realized in standard CMOS, it would be useful to devise a single figure of merit (FOM) to express their performance. Since a smart temperature sensor may be regarded as temperature-to-digital converter, an ADC FOM, involving energy per conversion and resolution could be defined."

The sensor of the present invention is superior to the prior art both in area and energy efficiency. It is the smallest sensor and also has the lowest nJ/conversion. It is noted that in integrated circuit thermal measurements, a resolution of 0.25° C. is sufficient, so it is not necessary to achieve such high resolutions as mentioned above and the area and energy tradeoffs are much more important.

The invention claimed is:

1. A sensor circuit comprising:
a first ring oscillator and a second ring oscillator, and a feedback loop coupled to said first and second ring oscillators such that currents in said first and second ring oscillators are equal or scaled and are determined by said feedback loop, wherein said first and second ring oscillators operate in a subthreshold region.

2. The sensor circuit according to claim 1, wherein at least one of said ring oscillators has a supply port supplied by at least one current source.

3. The sensor circuit according to claim 2, comprising a comparator configured to compare a frequency output of said at least one of said ring oscillators with a reference frequency to yield a measurement.

4. The sensor circuit according to claim 3, wherein the measurement is a temperature measurement.

5. The sensor circuit according to claim 1, wherein the first ring oscillator is coupled to a resistor at its positive supply port.

6. The sensor circuit according to claim 5, where said first ring oscillator is coupled at its positive supply port to a first node and the first node is coupled to a port of a resistor, whose second port is coupled to a second node, said second ring oscillator is coupled at its positive supply port to a third node, and said at least one current source comprises a first current source that supplies current to the second node and a second current source that supplies current to the third node.

7. The sensor circuit according to claim 6, wherein the first and second current sources are PMOS transistors, whose sources are both coupled to a positive supply voltage, Vdd and whose drains are coupled to the second node and third node, respectively, and gate voltages of the PMOS transistors are coupled to a fourth node, and an amplifier has inputs coupled with the second and third node and an output coupled with the fourth node.

8. The sensor circuit according to claim 2, wherein at least one frequency output of said at least one ring oscillator is input to a level shifter.

9. The sensor circuit according to claim 7, wherein an input node of the sensor circuit is initialized at a predetermined value in order to control start-up currents in the first and second current sources.

10. The sensor circuit according to claim 9, wherein said predetermined value is applied to the fourth node of the circuit and is determined by diode coupled devices.

11. A sensor circuit comprising a first ring oscillator and a second ring oscillator wherein a current density of said second ring oscillator is a scaled multiple of a current density of said first ring oscillator, and wherein said first and second ring oscillators operate in a subthreshold region, and wherein said first and second ring oscillators operate in a subthreshold region.

12. The sensor circuit according to claim 11, wherein currents in said first and second ring oscillators are functions of temperature such that the sensor circuit functions as a temperature sensor.

13. The sensor circuit according to claim 11, wherein scaling of currents of said first and second ring oscillators is done with a feedback circuit coupled to said first and second ring oscillators.

14. The sensor circuit according to claim 11, wherein a positive supply of said first ring oscillator is coupled to a first node and a positive supply of said second ring oscillator is coupled to a third node and a resistive element is coupled between the third node and a second node, and a feedback circuit equalizes voltages between the first and second nodes.

15. The sensor circuit according to claim 14, wherein the first node is coupled to a first input of a differential amplifier and the second node is coupled to a second input of the differential amplifier and an output of the differential amplifier is coupled to a node PG, which is coupled to a gate of a first PMOS and to a gate of a second PMOS, wherein a drain of the first PMOS is coupled to the first node and the drain of the second PMOS is coupled to the second node.

* * * * *